US 6,621,124 B2

(12) United States Patent
Ponomarev

(10) Patent No.: US 6,621,124 B2
(45) Date of Patent: Sep. 16, 2003

(54) SEMICONDUCTOR DEVICE AND METHOD OF MANUFACTURING SAME

(75) Inventor: Youri Ponomarev, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/795,002

(22) Filed: Feb. 28, 2001

(65) Prior Publication Data

US 2001/0017388 A1 Aug. 30, 2001

(30) Foreign Application Priority Data

Feb. 29, 2000 (EP) .......................................... 00200717

(51) Int. Cl.$^7$ ............................ H01L 21/00; H01L 21/84
(52) U.S. Cl. ....................... 257/347; 257/365; 257/366; 438/157
(58) Field of Search .................... 438/157; 257/347, 257/365, 366

(56) References Cited

U.S. PATENT DOCUMENTS

| 5,188,973 A | * | 2/1993 | Omura et al. | |
| 5,401,665 A | | 3/1995 | Chan | 437/40 |
| 5,461,250 A | * | 10/1995 | Burghartz et al. | 257/347 |
| 5,705,405 A | * | 1/1998 | Cunningham | |
| 5,736,435 A | | 4/1998 | Venkatesan et al. | 438/151 |
| 5,923,963 A | * | 7/1999 | Yamanaka | 438/157 |
| 6,342,717 B1 | * | 1/2002 | Komatsu | 257/347 |

FOREIGN PATENT DOCUMENTS

| EP | 1056135 A1 | 11/2000 |
| JP | 4307972 A | 10/1992 |

* cited by examiner

Primary Examiner—Richard Booth
(74) Attorney, Agent, or Firm—Aaron Waxler

(57) ABSTRACT

The semiconductor device has a semiconductor body (1) having a field effect transistor (4) at a first surface (2) and a second gate (10) at a second surface (3). The second gate is present in a recess (11) in the semiconductor body (1) which is accurately aligned with a first gate (8) of the field effect transistor (4) on the first surface (2). The method of manufacturing the semiconductor device comprises the step of implanting ions into a semiconductor body (1) which has a first gate (8) on a first surface (2) and a silicon oxide layer (17) on a second surface (3). The implantation is done from the first surface (2) in a direction substantially perpendicular to that surface. The implantation has the effect that behind the first gate (8) an implanted region (18) is formed in the semiconductor body (1) and a circumferential implanted zone (19) in the silicon oxide layer (17). Silicon oxide is formed in the implanted region (18) by dopant-enhanced oxidation. The silicon oxide layer (17) and the silicon oxide in the region (18) are removed so as to form a recess (11), which is filled with second gate material (20) from which the second gate (10) is formed.

The second gate is effective in suppressing short-channel effects.

6 Claims, 3 Drawing Sheets

SEMICONDUCTOR DEVICE AND METHOD OF MANUFACTURING SAME

The invention relates to a semiconductor device with a silicon semiconductor body having a first surface and a second surface facing away from the first, provided with a field effect transistor comprising a source, a drain, an interposed channel, and a first gate arranged opposite the channel on the first surface, said gate having a dimension along said first surface, and provided with a second gate provided on the second surface opposite the first gate.

The invention also relates to a method of manufacturing a semiconductor device with a silicon semiconductor body having a first surface and a second surface facing away from the first, and provided with a field effect transistor comprising a source, a drain, an interposed channel and a first gate provided on the first surface opposite the channel, and a second gate of a second gate material provided on the second surface opposite the channel.

Such a semiconductor device is known from JP-A-04 307972.

The known semiconductor device is provided with a second gate.

The use of a second gate is the suppression of short-channel effects in field effect transistors (FETs) with a comparatively short first gate. If the first gate is comparatively short, the channel between source and drain is comparatively short. Short-channel effects are effects in a field effect transistor having a short channel which are caused by the extension of the depletion region of the drain into the channel under the influence of a voltage on the drain. To suppress these short-channel effects, a second gate is present, and this second gate has to be accurately positioned opposite the channel of the FET. Field effect transistors are made increasingly smaller, with a shorter first gate and accordingly a shorter channel, especially for increasing the speed and the current-carrying power. There is a worldwide demand for improving the performance and reliability of FETs through the suppression of short-channel effects.

In the known semiconductor device, the second gate is manufactured by lithography and etching. It is practically impossible, however, to carry out lithographic operations on the second surface in locations which are accurately aligned with respect to the first surface.

As the gates of FETs are shorter, alignment errors and differences in dimensions of the second gate become relatively increasingly greater. In small FETs with gate lengths <100 nm, the operation is largely determined by the position and dimension of the second gate with respect to the first gate. If the second gate is not correctly aligned with respect to the first gate of the FET, there is an insufficient control over the channel, so that short-channel effects are insufficiently suppressed. If the second gate extends farther than only opposite the channel, moreover, there will be undesirable overlap capacitances between the second gate and the semiconductor body, whereby the speed of the transistor is seriously reduced. The spread in the properties of the products increases in proportion as the gate lengths are smaller.

A major disadvantage of the known device is that products from one and the same batch have diverging properties as a result of the method by which they were manufactured. The position of the second gate is not accurately defined with respect to the first gate of the FET and varies from one device to the next in devices belonging to one batch. Another disadvantage is that the dimension of the second gate also varies.

It is an object of the invention to provide a semiconductor device of the kind described in the opening paragraph in which the second gate has an accurately defined position with respect to the first gate.

The invention also has for its object to provide a method of manufacturing the device described in the opening paragraph which positions the second gate accurately with respect to the first gate.

This object is achieved in the device according to the invention in that the semiconductor body has a recess with a depth in the second surface, which recess is concentric with a substantially perpendicular projection of the first gate, and in which recess the second gate is present.

Since the semiconductor body has a recess in the second surface which is concentric with a substantially perpendicular projection of the first gate, the second gate being present in said recess, the second gate is closer to the channel in the semiconductor body than if no such recess were present in the semiconductor body. In addition, the distance from the second gate to the channel is shorter because the second gate lies substantially perpendicularly below the first gate, compared with the situation in which the second gate is laterally shifted.

There is a better control over the channel as a result, whereby short-channel effects are better suppressed. Lower source-drain series resistances are also realized, and the overlap capacitances between a portion of the second gate which may be present next to the channel and the semiconductor body are reduced. The performance of the FET is improved thereby. The current-carrying power and the speed are especially enhanced. The spread among products from one batch is also narrowed.

The dimension of the second gate may differ from that of the first gate, but in a favorable embodiment the second gate has a dimension along the second surface, averaged over the depth of the recess, which corresponds substantially to at most the dimension of the first gate.

Overlap capacitances between portions of the second gate laterally of a perpendicular projection of the first gate and the semiconductor body are substantially minimized. The speed of the transistor is improved thereby.

The location of the second gate is accordingly limited, and the dimension of the second gate is accordingly accurately defined with respect to the first gate of the FET, so that the properties of the semiconductor device are laid down within narrow limits.

The recess may be filled only partly, but it is favorable when the recess is completely filled by the second gate.

The material from which the second gate is made may be comparatively strongly doped polycrystalline silicon or a metal. A closed layer of gate material in the recess, for example a layer which covers the bottom wall of the recess, is sufficient already for a satisfactory operation of the second gate. To reduce the resistance of the second gate, it is favorable when the recess is completely filled with the second gate. It is alternatively possible, however, for the second gate to cover only a portion of the bottom wall and to be smaller than the first gate.

A gate dielectric may be present between the first gate and the first surface, so that the field effect transistor operates as a metal-insulator-semiconductor field effect transistor (MISFET). A field effect transistor with a gate dielectric has a lower gate leakage current than a field effect transistor without a gate dielectric.

A gate dielectric may be present in the recess, between the second gate and the semiconductor body, so that the second gate is capacitively coupled to the semiconductor body. A major advantage of a capacitive coupling is a low gate leakage current. The control of the second gate over the channel is better in proportion as the gate dielectric is thinner.

The semiconductor body lies on an oxide layer and, for example, a silicon substrate during the manufacture of the semiconductor device. It is favorable when the semiconductor body has a lowest possible parasitic capacitive coupling to the substrate. If a second substrate is present against the first gate and the first surface of the semiconductor body, the device will have an additional sturdiness for the purpose of removing the original silicon substrate and the oxide layer. If the second substrate has a dielectric constant which is lower than the effective dielectric constant of the oxide layer with the silicon substrate, the parasitic coupling between the semiconductor body and the second substrate will be reduced.

The object of the invention as regards the method is realized—according to the invention—in that the semiconductor body with the first gate on the first surface and a silicon oxide layer on the second surface is implanted with dopant ions in a direction substantially perpendicular to the first surface and through the first surface so as to form an implanted region behind the first gate in the silicon semiconductor body and an implanted zone in the silicon oxide layer around said region, whereupon silicon oxide is formed by dopant-enhanced oxidation in the implanted region and the silicon oxide in said region and the silicon oxide layer are removed, such that a recess is created in the second surface at the area of said region, and the second gate material is provided in said recess, from which material the second gate is formed.

The method according to the invention is essentially based on the recognition that the oxidation speed depends on the local doping level. Dopant ions, for example Sb, As, P, or B, are implanted in a direction substantially perpendicular to the first surface both through the first gate and through the first surface. The dopant ions lose part of their energy at the area of the first gate owing to collision processes in the first gate, so that the implanted region lies behind the gate in the semiconductor, whereas this energy loss does not occur in the zone around the first gate, and the dopant ions are implanted more deeply, i.e. in the oxide layer. The implanted region in the semiconductor body lies substantially perpendicularly behind the first gate and is comparatively strongly doped. The implanted region has a steeper concentration profile of the dopant ions at the edges if implantation took place with heavy ions, such as arsenic and antimony, than if implantation took place with lighter ions, such as boron and phosphorus. Since the oxidation speed depends on the doping level, the oxide layer grows faster at the area behind the first gate in the comparatively strongly doped region of the silicon semiconductor body than in the comparatively weakly doped surrounding silicon zone during the oxidation process. This causes a recess of a certain depth which is concentric with a substantially perpendicular projection of the first gate in the second surface of the semiconductor body at the area of the implanted region. During the oxidation, the dopant ions implanted into the zone of the oxide layer remain in the oxide layer.

After a second substrate has been provided on the first surface of the Si semiconductor body and the first gate, the entire product is turned upside down. The silicon oxide layer with the silicon oxide formed during the dopant-enhanced oxidation is removed.

The second gate may be provided in various ways. Thus the second gate may be made in that a layer of a second gate material, for example polycrystalline silicon or metal, is deposited on the second surface with the recess and subsequently the layer laterally of the recess is removed from the second surface, for example by polishing.

The second gate material remains in the recess at the area of the recess, so that at least the bottom wall of the recess is covered, or the entire recess is filled up with the second gate, depending on the thickness of the layer and the depth of the recess.

A second gate is made in this manner which is substantially perpendicularly below the first gate and has substantially the same dimensions as the first gate.

The second gate may alternatively be made as follows. A layer of second gate material, for example polycrystalline silicon or metal, is deposited on the second surface with the recess. A photoresist layer is provided over the gate material. The photoresist is a negative resist. The photoresist layer is exposed to light. The light is reflected by the second gate material. The photoresist situated above the center of the recess is exposed most strongly. After development of the photoresist layer, the pattern of the second gate in statu nascendi remains in the resist. This pattern in the resist lies accurately centered with respect to the center of the recess and serves as a mask in the subsequent etching of the second gate material. The resist is removed, and the second gate has been completed.

Optionally, a gate dielectric may be provided in the recess before the second gate material is provided.

The gate dielectric in the recess of the second surface between the second gate and the second surface serves to realize a low gate leakage current.

The semiconductor device may comprise a CMOS logic circuit, memories, or a combination of the two. In logic applications, the voltage gain and the depletion mode operation are important, whereas it is important in memory applications to be able to modulate the current over different orders of magnitude. An additional advantage is that the second gate may be used both in CMOS logic and in memories. It is possible to combine logic with memory applications, with the possibility of making the second gate in the recess in one process simultaneously for all transistors of the semiconductor device.

It is in addition possible to manipulate two-dimensional effects in the inversion channel with the second gate in the recess of the silicon semiconductor body. The width of the inversion channel is so small that it is in fact a quantum well with a two-dimensional electron gas. This confinement renders it possible to make a device based on Coulomb blockade, single-electron effects, or quantum effects such as charge quantization.

These and other aspects of the device according to the invention will be described in more detail with reference to the drawings, in which:

FIG. 2 shows a sequence of steps in the method of manufacturing the semiconductor device, FIGS. 2a to 2e showing cross-sections of intermediate products; wherein

FIG. 3 shows a sequence of steps in a modification of the method of manufacturing the second gate; wherein

Figure 1:
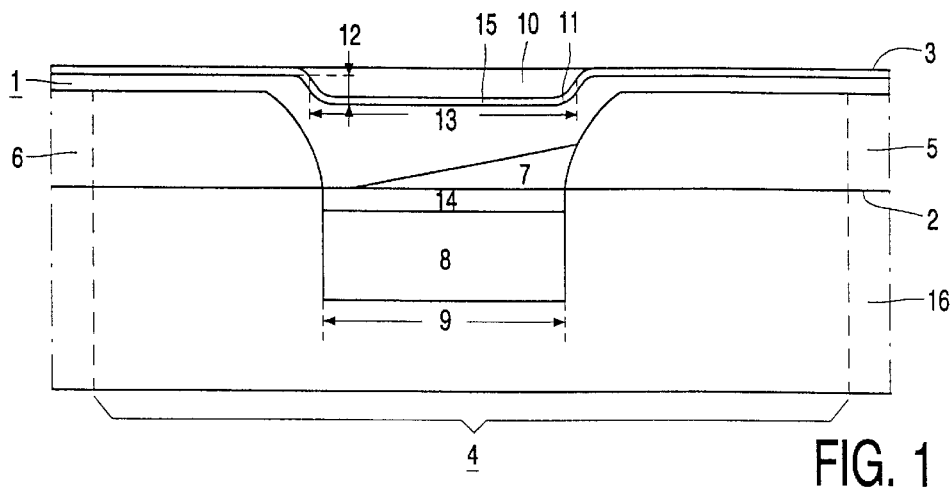
FIG. 1 shows an embodiment of the semiconductor device in cross-section.

The semiconductor device of FIG. 1 has a silicon semiconductor body 1 with a first surface 2 and a second surface 3 facing away from the first, and a field effect transistor 4. The field effect transistors 4 comprises a source 5, a drain 6, an interposed channel 7, and a first gate 8 provided opposite the channel 7 on the first surface 2. The first gate 8 has a dimension 9 along the first surface 2. A second gate 10 is provided on the second surface 3 opposite the first gate 8. The second gate 10 lies in a recess 11 which has a depth 12. The recess 11 is present in the second surface 3 of the semiconductor body 1 so as to be concentric with a substantially perpendicular projection of the first gate 8.

The second gate 10 in the embodiment shown has an average dimension 13 along the second surface 3 over the depth 12 of the recess 11 which is substantially equal to the dimension 9 of the first gate 8.

The average dimension 13 of the second gate 10 in the embodiment shown is essentially at most equal to the dimension 9 of the first gate 8. The recess 11 in the Figure is substantially completely filled by the second gate 10. Between the first gate 8 and the first surface 2 there is a gate dielectric 14 in the embodiment shown. A second gate dielectric 15 is present between the second gate 10 and the second surface 3 in the embodiment shown. A substrate 16 lies against the first gate 8 and the first semiconductor body 1.

In FIG. 2, corresponding parts have been given the same reference numerals as in FIG. 1.

Figure 2A:
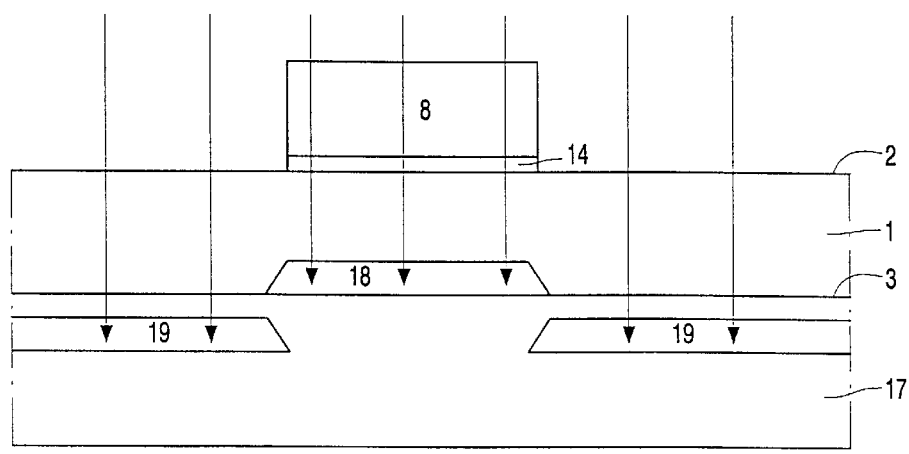
FIG. 2a is a cross-sectional view of the intermediate product after implantation, whereby a strongly doped region has been formed at the area behind the first gate.

In FIG. 2a, the semiconductor body 1 has a silicon oxide layer 17 on the second surface 3. The semiconductor body 1 may be, for example, the silicon of a silicon-on-insulator (SOI) wafer, and the silicon oxide layer 17 on the second surface 3 may be, for example, the buried oxide of the SOI wafer. Preferably, the silicon semiconductor body 1 is thin, approximately 100 nm.

The first gate 8 is present on the first surface 2 of the semiconductor body 1. The material of the first gate may be, for example, polycrystalline silicon or a metal. It is also possible for the first gate 8 to be a so-called dummy gate at this stage in the manufacturing process. The material of the dummy gate may be, for example, polycrystalline silicon, nitride, oxide, or a resist, or a combination of these materials. The material of the dummy gate is replaced by, for example, highly doped polycrystalline silicon or a metal in a so-called replacement gate process at a later stage in the manufacturing process.

The semiconductor body 1 with the first gate 8 on the first surface 2 and the silicon oxide layer 17 on the second surface 3 is implanted with dopant ions in a direction substantially perpendicular to the first surface 2 and right through the first surface 2.

An implanted region 18 is formed in situ behind the first gate 8 in the silicon semiconductor body 1 with a typical doping level of, for example, $10^{20}$ at/cm$^3$, and an implanted zone 19 is formed in the silicon oxide layer 17 surrounding said region. The dopant ions are thermally activated, for example by rapid thermal processing.

Figure 2B:
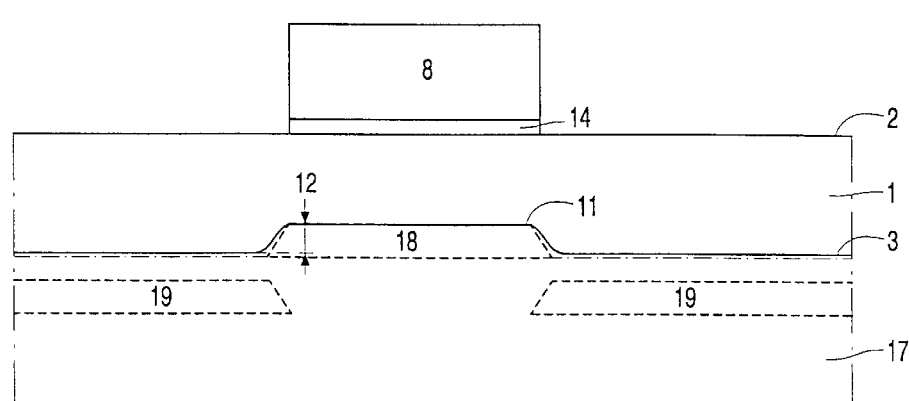
FIG. 2b is a cross-sectional view of the intermediate product after dopant-enhanced oxidation whereby a recess has been formed in the second surface of the semiconductor body.

FIG. 2b is a cross-sectional view of the semiconductor body 1 with a gate dielectric 14, a first gate 8, and an oxide layer 17 after dopant-enhanced oxidation. Since the oxidation speed depends on the doping level, the oxide layer 17 at the area behind the first gate 8 in the comparatively strongly doped region 18 of the silicon semiconductor body 1 grows faster during oxidation than it does in the Si semiconductor body 1 around the strongly doped implanted region 18. For example, if the P doping in the strongly doped region 18 is approximately $3 \times 10^{20}$ at/cm$^3$ and the P doping is electrically activated for 20 s at 1030° C., an additional silicon oxide with a thickness of approximately 30 nm will grow from the silicon oxide layer 17 in the case of thermal oxidation at 700° C. for 15 min in $O_2$ in the strongly doped P region 18 of the Si semiconductor body, whereas no more than 3 nm silicon oxide is formed around the strongly doped region. This causes a recess 11 with a depth 12 in the second surface 3 of the semiconductor body 1 at the area of the implanted region 18, which recess is concentric with a substantially perpendicular projection of the first gate 8 and is still filled with silicon oxide.

Figure 2C:
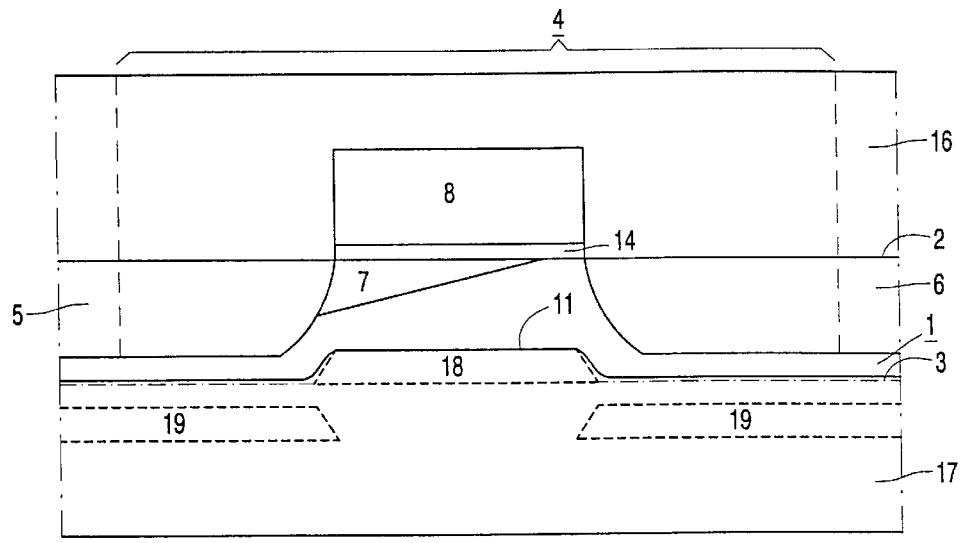
FIG. 2c is a cross-sectional view of the intermediate product in which the source and drain have been manufactured and a substrate has been provided against the first gate and the first surface of the semiconductor body.

FIG. 2c is a cross-sectional view of the intermediate product after the source 5 and the drain 6 have been implanted and the doping has been activated by rapid thermal processing. A channel 7 is present between the source 5 and the drain 6 below the first gate 8 of the field effect transistor 4. A substrate 16 is provided against the first gate 8 and the first surface 2 of the semiconductor body 1. The substrate 16 preferably has a low dielectric constant, such as is the case for glass.

Figure 2D:
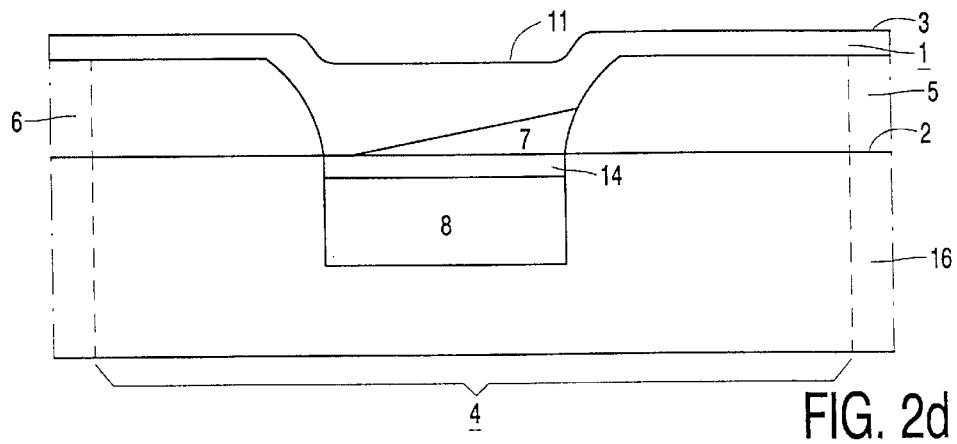
FIG. 2d is a cross-sectional view of the intermediate product after the removal of the silicon oxide layer and a reversal of the intermediate product.

FIG. 2d is a cross-sectional view of the intermediate product after the entire product has been turned upside down and the oxide layer 17 has been removed, for example by wet chemical etching, whereby the recess 11 has been created.

Figure 2E:
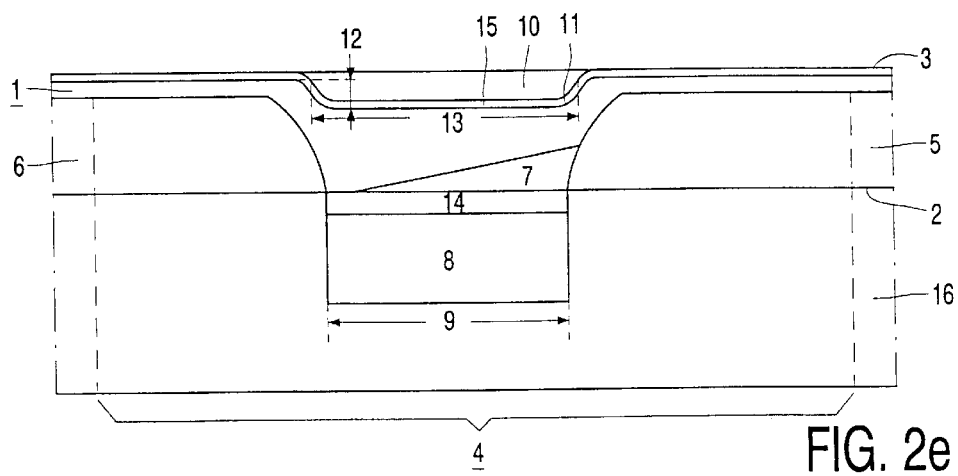
FIG. 2e is a cross-sectional view of the intermediate product in which the recess in the semiconductor body has been completely filled by the second gate.

FIG. 2e is a cross-sectional view of the intermediate product after the application of the second gate 10. The second gate 10 is made of a second gate material, for example a metal such as aluminum, or of titanium nitride. A second gate dielectric 15 is provided between the second gate 10 and the semiconductor body 1, for example by chemical vapor deposition, in the embodiment shown.

In FIG. 3, corresponding parts have been given the same reference numerals as in FIGS. 1 and 2.

Figure 3A:
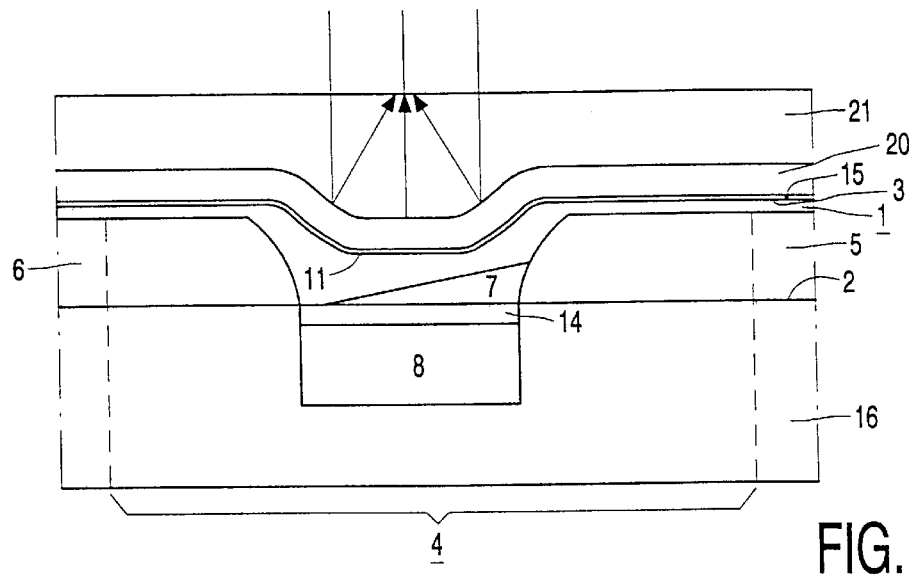
FIG. 3a is a cross-sectional view of the intermediate product in which the photoresist is being exposed.

FIG. 3a is a cross-sectional view of the intermediate product in which the photoresist has been exposed. A photoresist layer 21 was provided over a layer of second gate material 20. The photoresist is a negative resist. The photoresist layer 21 is entirely exposed. The light is reflected by the layer of second gate material 20. The photoresist situated in the center of the recess 11 is exposed most strongly owing to reflection.

Figure 3B:
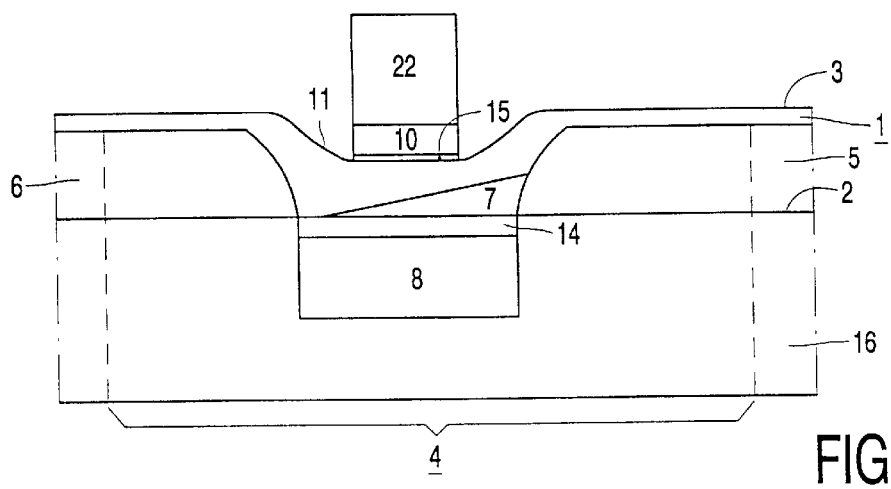
FIG. 3b is a cross-sectional view of the intermediate product after the development of the photoresist and etching of the second gate material.

FIG. 3b is a cross-sectional view of the intermediate product after the development of the photoresist and etching of the second gate material 20 so as to form the second gate 10. After development of the photoresist layer 21, the pattern 22 of the second gate remains present in the resist. This pattern 22 in the resist lies accurately centered with respect to the center of the recess 11 and serves as a mask during etching of the layer of gate material 20 for obtaining the second gate 10.

Figure 3C:
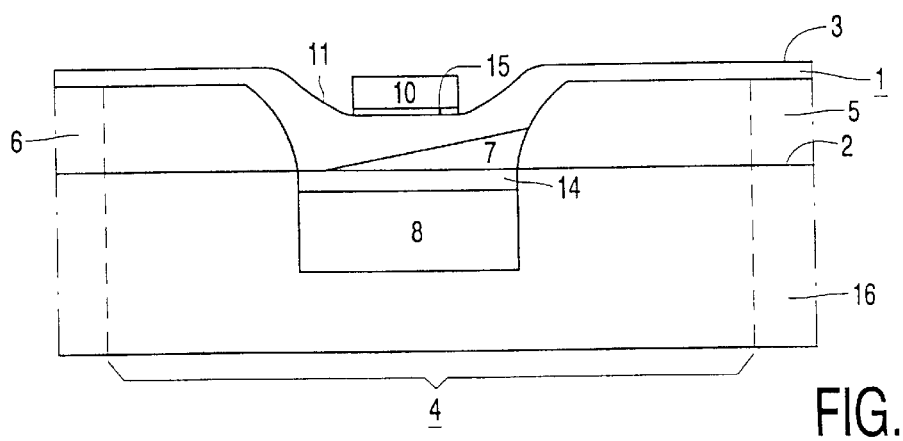
FIG. 3c is a cross-sectional view of the semiconductor device with the second gate in the recess.

FIG. 3c is a cross-sectional view of the semiconductor device. The pattern 22 of the second gate in the resist has been removed, and the second gate 10 has been made in the recess 11.

What is claimed is:

1. A semiconductor device, comprising:

a silicon semiconductor body (1) having a first surface (2) and a second surface (3) facing away from the first; and a field effect transistor (4) including a source (5), a drain (6), an interposed channel (7), and a first gate (8) arranged opposite the channel (7) on the first surface (2), said first gate (8) having a dimension (9) along said first surface (2), and provided with a second gate (10) provided on the second surface (3) opposite the first gate (8), wherein the semiconductor body (1) has a recess (11) with a depth (12) in the second surface (3), which recess (11) is concentric with a substantially perpendicular projection of the first gate (8), and in which recess (11) the second gate (10) is present to a depth that is equal to or less than the depth of the recess (11).

2. A semiconductor device as claimed in claim 1, characterized in that the second gate (10) has a dimension (13) along the second surface (3), averaged over the depth (12) of the recess (11), which corresponds substantially to at most the dimension (9) of the first gate (8).

3. A semiconductor device as claimed in claim 1 or 2, characterized in that the recess (11) is substantially entirely filled by the second gate (10).

4. A semiconductor device as claimed in claim 1 or 2, characterized in that a gate dielectric (14) is present between the first gate (8) and the first surface (2).

5. A semiconductor device as claimed in claim 1 or 2, characterized in that a gate dielectric (15) is present between the second gate (10) and the second surface (3).

6. A semiconductor device as claimed in claim 1, characterized in that a substrate (16) lies against the first gate (8) and the first surface (2) of the semiconductor body (1).

* * * * *